(12) United States Patent
Maa et al.

(10) Patent No.: US 6,967,112 B2
(45) Date of Patent: Nov. 22, 2005

(54) THREE-DIMENSIONAL QUANTUM DOT STRUCTURE FOR INFRARED PHOTODETECTION

(75) Inventors: Jer-Shen Maa, Vancouver, WA (US); Jong-Jan Lee, Camas, WA (US); Douglas J. Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 22 days.

(21) Appl. No.: 10/794,158

(22) Filed: Mar. 3, 2004

(65) Prior Publication Data

US 2005/0196894 A1 Sep. 8, 2005

Related U.S. Application Data

(63) Continuation-in-part of application No. 10/755,567, filed on Jan. 12, 2004, and a continuation-in-part of application No. 10/746,952, filed on Dec. 23, 2003.

(51) Int. Cl.[7] .......................... H01L 31/26; H01L 21/66
(52) U.S. Cl. .............................. 438/14; 438/31; 438/61
(58) Field of Search .............................. 438/14, 22, 31, 438/32, 61, 455, 597

(56) References Cited

U.S. PATENT DOCUMENTS

| 5,229,320 | A | 7/1993 | Ugajin ........................ 438/694 |
|---|---|---|---|
| 5,482,890 | A | 1/1996 | Liu et al. .................... 438/494 |
| 5,614,435 | A | 3/1997 | Petroff et al. ................. 117/85 |
| 5,683,595 | A | 11/1997 | Nagamachi et al. ... 204/192.34 |
| 6,139,626 | A | 10/2000 | Norris et al. ................. 428/323 |
| 6,242,326 | B1 | 6/2001 | Ro et al. ..................... 438/493 |
| 6,333,214 | B1 | 12/2001 | Kim et al. ................... 438/124 |
| 6,346,431 | B1 | 2/2002 | Yoo et al. .................... 438/94 |
| 6,541,788 | B2 | 4/2003 | Petroff et al. ................. 257/21 |
| 6,632,694 | B2 * | 10/2003 | Torvik .......................... 438/22 |
| 2004/0053469 | A1 * | 3/2004 | Park ........................... 438/264 |
| 2004/0152225 | A1 * | 8/2004 | Chen et al. ................... 438/46 |

OTHER PUBLICATIONS

P. Boucaud, V. Le Thanh, S. Sauvage, D. Débarre, and D. Bouchier, Appl. Phys. Lett., 74, 1999, 401.

* cited by examiner

Primary Examiner—Phuc T. Dang
(74) Attorney, Agent, or Firm—David C. Ripma; Joseph P. Curtin; David A. Cordeiro

(57) ABSTRACT

A 3D quantum dot optical path structure is provided, along with a method for selectively forming a 3D quantum dot optical path. The method comprises: forming a single crystal Si substrate with a surface; forming a Si feature in the substrate, such as a via, trench, or pillar; forming dots from a Ge or SiGe material overlying the Si feature; and, forming an optical path that includes the dots. In some aspects of the method, the Si feature has defect sites. For example, the Si feature may be formed with a miscut angle. As a result of the miscut angle, steps are formed in the Si feature plane. Then, the dots are formed in the Si feature steps. The miscut angle is in the range between 0.1 and 5 degrees, and the spacing between steps is in the range between 1 and 250 nanometers (nm).

34 Claims, 5 Drawing Sheets

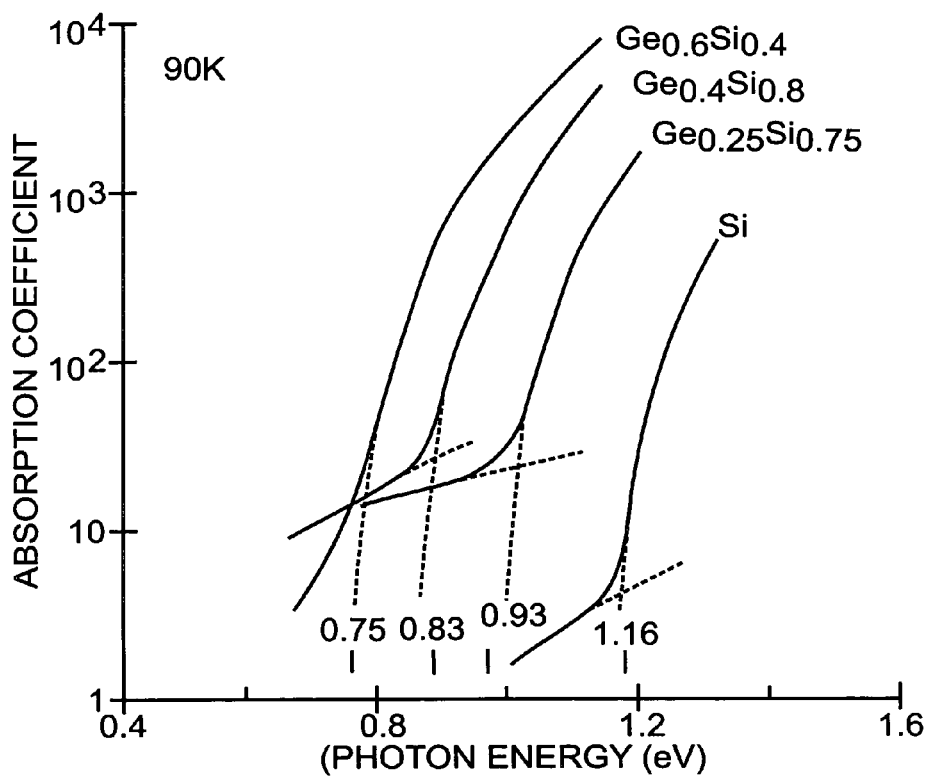
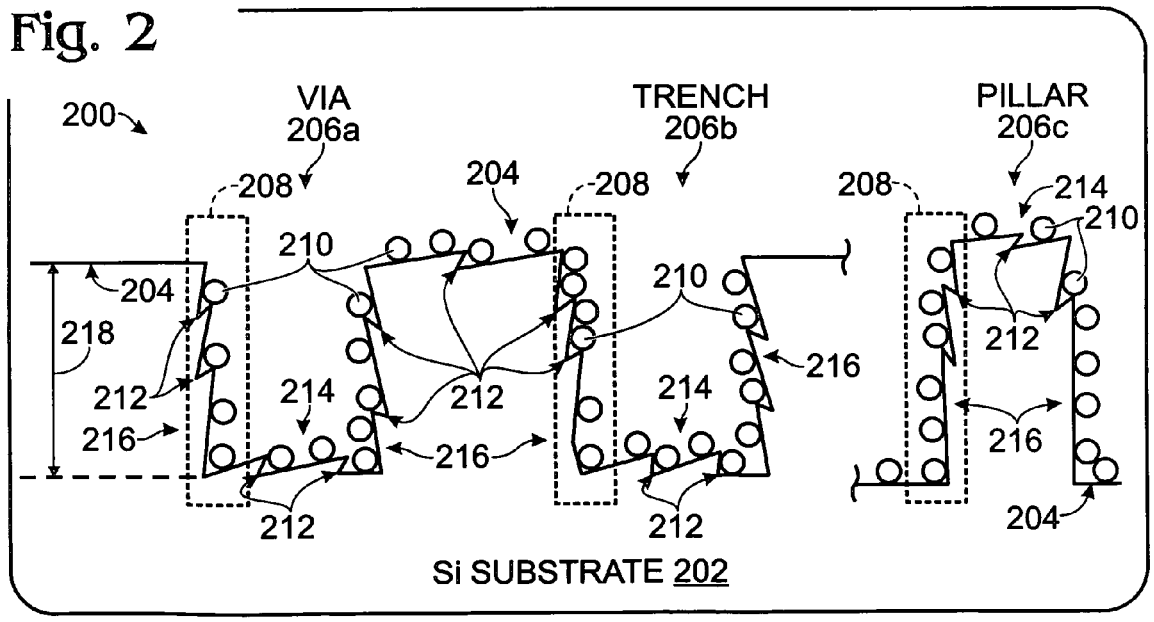

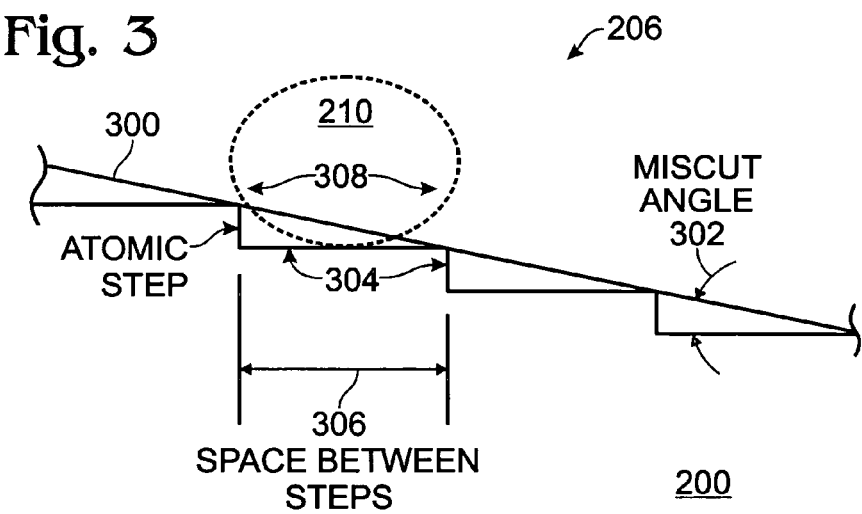
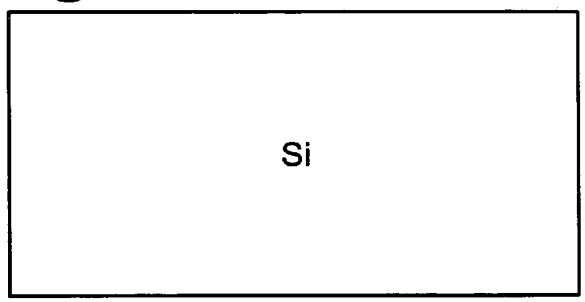
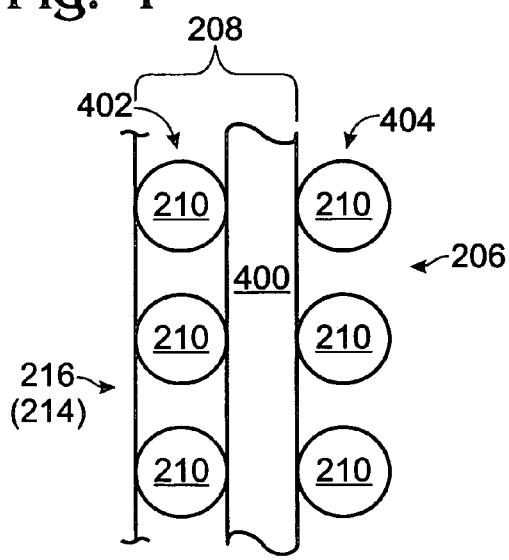
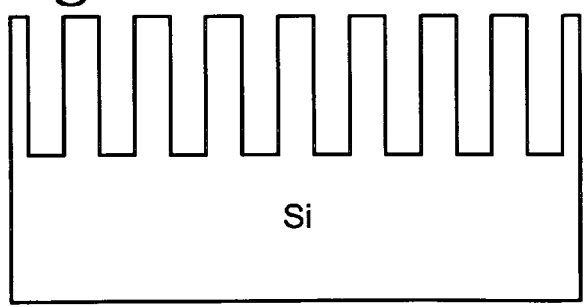

THREE-DIMENSIONAL QUANTUM DOT STRUCTURE FOR INFRARED PHOTODETECTION

RELATED APPLICATIONS

This application is a continuation-in-part of a pending patent application entitled, SURFACE-NORMAL OPTICAL PATH STRUCTURE FOR INFRARED PHOTODETECTION, invented by Lee et al., Ser. No. 10/746,952, filed Dec. 23, 2003.

This application is a continuation-in-part of a pending patent application entitled, VERTICAL OPTICAL PATH STRUCTURE FOR INFRARED PHOTODETECTION, invented by Tweet et al., Ser. No. 10/755,567 filed Jan. 12, 2004.

BACKGROUND OF THE INVENTION

1. Field of the Invention

This invention generally relates to integrated circuit (IC) fabrication processes and, more particularly, to a quantum dot three-dimensional optical path structure and corresponding fabrication method.

2. Description of the Related Art

There are many applications for photodetection in the near infrared region (the wavelength between 0.7 micron to 2 microns), such as in fiber-optical communication, security, and thermal imaging. Although III-V compound semiconductors provide superior optical performance over their silicon (Si)-based counterparts, the use of Si is desirable, as the compatibility of Si-based materials with conventional Si-IC technology promises the possibility of cheap, small, and highly integrated optical systems.

Silicon photodiodes are widely used as photodetectors in the visible light wavelengths due to their low dark current and the above-mentioned compatibility with Si IC technologies. Further, silicon-germanium ($Si_{1-x}Ge_x$) permits the photodetection of light in the 0.8 to 1.6 micron wavelength region.

However, the SiGe alloy has larger lattice constant than the Si lattice, so film thickness is a critical variable in the epitaxial growth of SiGe on Si substrates. While a thick SiGe is desirable for light absorption, too thick of a SiGe film causes a defect generation that is responsible for dark currents. This critical SiGe thickness is dependent upon the Ge concentration and device process temperature. Higher Ge concentrations and higher device process temperatures result in the formation of thinner SiGe film thicknesses. In common practice, the SiGe critical thickness is in the range of a few hundred angstroms, to maximum of a few thousand angstroms. Once the SiGe thickness is grown beyond its critical thickness, lattice defects in SiGe are inevitable. As mentioned above, an IR photo detector built from a SiGe film with lattice defects generates large dark currents and noise.

Quantum efficiency is a measure of the number of electron-hole pairs generated per incident photon, and it is a parameter for photodetector sensitivity. Quantum efficiency is defined as:

$$\eta=(I_p/q)/(P_{opt}/hv)$$

where $I_p$ is the current generated by the absorption of incident optical power $P_{opt}$ at the light frequency v.

FIG. 1 is a graph showing the relationship between quantum efficiency and the percentage of Ge in a SiGe film. One of the key factors in determining quantum efficiency is the absorption coefficient, α. Silicon has a cutoff wavelength of about 1.1 microns and is transparent in the wavelength region between 1.3 to 1.6 microns. The SiGe absorption edge shifts to the red with an increasing Ge mole fraction and is shown in FIG. 1. The absorption coefficient of any SiGe alloy is relatively small and the limited thickness dictated by the critical thickness further limits the ability of SiGe films to absorb photons.

As noted above, the major goals of SiGe-based photodetection are high quantum efficiency and the integration of these SiGe photodetectors with the existing Si electronics. One way to increase the optical path, and improve the quantum efficiency, is to form the optical path in the same plane as the SiGe film, along the substrate surface in which the SiGe is deposited. Thus, light propagates parallel to the heterojunction (SiGe/Si) interface. However, this optical path design necessarily limits the design of IR detectors.

The IR absorption length of SiGe is long and thus a thick SiGe layer, greater than 1 micron for example, is required to achieve high IR absorption and high quantum efficiency. However, it is very difficult to grow a defect-free thick SiGe film on a Si substrate because of the lattice mismatch between these two materials. As described in pending application SURFACE-NORMAL OPTICAL PATH STRUCTURE FOR INFRARED PHOTODETECTION, which is incorporated herein by reference, a long SiGe optical path can be formed without necessarily forming a thick SiGe film. By growing the SiGe film on the sidewall of a Si trench or pillar, any IR light entering the device and traveling along the sidewall, encounters a long optical path. A long optical path improves the quantum efficiency.

However, growing the SiGe by a blanket deposition technique results in SiGe growth on the bottom of the trenches and top of the wafer, as well as on the sidewalls. Although SiGe has a larger lattice constant than Si, it can be grown lattice-matched to Si, up to the so-called critical thickness. Consequently, SiGe grown on the sidewalls has the Si lattice constant parallel to the sidewalls, but a larger lattice constant perpendicular to them. At the same time, the SiGe grown at the bottom of the trenches and top of the wafer has the Si lattice constant parallel to those surfaces, but a larger one perpendicular to them. Crystals originating from these different surfaces consequently have defected regions where they meet.

Large two-dimensional focal plane arrays in the mid- and far-infrared region can also be made using compound semiconductors such as indium antimonide or mercury cadmium telluride detector arrays bonded to a Si chip for multiplexing. However, this approach is expensive and difficult. Another method is to use quantum well infrared photodetectors (QWIP). But QWIPs are insensitive to normal incident light.

To overcome the above-mentioned limitations associated with two-dimensional structures, and to extend performance to near-infrared range of the spectrum, stress-induced quantum dots have been considered for use in a quantum dot infrared detector (QDIP). The size and distribution of the quantum dots are controlled in accordance with the Stranski-Krastanow heteroepitaxy growth mode, using a lattice mismatch between the film and the substrate material. Two-dimensional arrays of quantum dots may be formed using lithographic techniques to form a thin dielectric pattern. Beam irradiations and thermal etching techniques are also known. A multilayer quantum dot structure can also be formed by first depositing the multiple layers, followed by a heat treatment step to induce an agglomeration process to form the quantum dots. Other techniques form colloidal nanocrystals through sintering on porous template. However, these 2D quantum dot processes are relatively complex.

To avoid the above-mentioned problems inherent with a two-dimensional interface between films, it would be advantageous if a long length SiGe optical path structure could be formed using a three-dimensional array of SiGe quantum dots.

SUMMARY OF THE INVENTION

The present invention is a three-dimensional quantum dot structure formed from a simple one-layer deposition, using surface relief aspects of the substrate. With a pre-arranged substrate orientation, the precise location of quantum dots, as well as their size and distribution, can be reliably controlled. Therefore, an IR detector of improved spectral sensitivity and reproducibility can be fabricated.

Accordingly, a method is provided for selectively forming a three-dimensional quantum dot optical path for IR photodetection. The method comprises: forming a single crystal Si substrate with a surface; forming a Si feature in the substrate, such as a via, trench, or pillar; forming dots from a Ge or SiGe material overlying the Si feature; and, forming an optical path that includes the dots.

In some aspects of the method, the Si feature has defect sites. For example, the Si feature may be formed along a plane in the substrate with a miscut angle. As a result of the miscut angle, steps are formed in the Si feature plane. Then, the dots are formed in the Si feature steps. The miscut angle is in the range between 0.1 and 5 degrees, and the spacing between steps is in the range between 1 and 250 nanometers (nm). The dots have a diameter in the range between 3 and 100 nm.

Additional details of the above-described method and a 3D quantum dot optical path structure for IR photodetection are provided below.

BRIEF DESCRIPTION OF THE DRAWINGS

FIG. 1 is a graph showing the relationship between quantum efficiency and the percentage of Ge in a SiGe film.

FIG. 2 is a partial cross-sectional view of the present invention 3D quantum dot optical path structure for IR photodetection.

FIG. 3 is a partial cross-section detailed view of the Si feature sidewall or Si feature surface of FIG. 2.

FIG. 4 is a partial cross-sectional view featuring an alternate aspect of the optical path structure of FIG. 2.

FIGS. 5 through 10 illustrate steps in the fabrication of the present invention 3D quantum dot IR optical path structure.

DETAILED DESCRIPTION OF THE PREFERRED EMBODIMENTS

Figure 7:
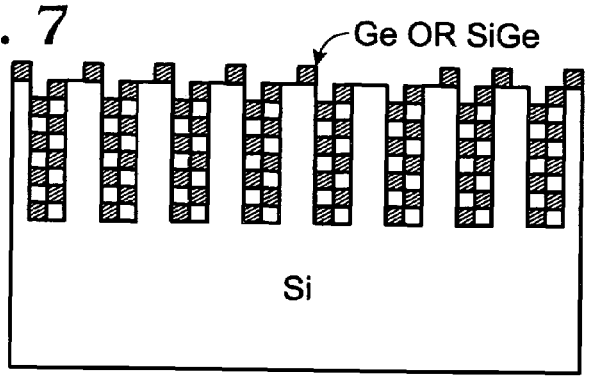
Figure 8:
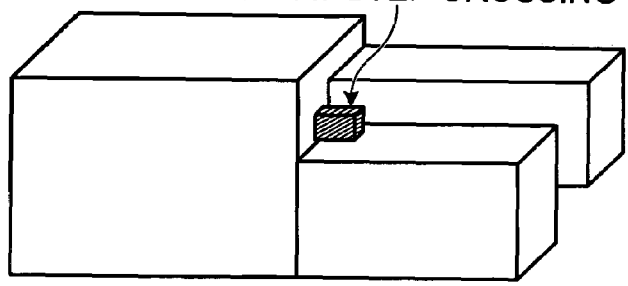

FIG. 2 is a partial cross-sectional view of the present invention 3D quantum dot optical path structure for IR photodetection. The structure 200 comprises a single-crystal Si substrate 202 with a surface 204. A Si feature 206 is formed in the Si substrate surface 204. More specifically, a via feature 206a, trench feature 206b, and pillar feature 206c are shown. A 3D optical path 208 with dots 210 of a first material including germanium (Ge) is formed on Si feature.

The optical path first material dots 210 include a first material of either Ge or SiGe. Alternately stated, the dots have a Ge concentration in the range from 5 to 100%. In one aspect of the structure 200, the Si feature 206 includes defect sites 212. The dots 210 are more likely to form in the defect sites than on the feature sidewalls 216 or feature surfaces 214. The Si feature 206 has a height 218 that is in the range of 0.3 to 5 microns. In other aspects of the invention, the substrate 200 need not single-crystal Si, especially if the quantum dots 210 are to randomly deposited. However, as explained below, a single-crystal Si substrate permits a controlled number of defect sites to be produced.

FIG. 3 is a partial cross-section detailed view of the Si feature sidewall or Si feature surface of FIG. 2. The Si feature 206 is formed along a plane 300 in the substrate with a miscut angle 302, and includes steps 304 in the Si feature plane responsive to the miscut angle 302. The same miscut angle is typically formed in the sidewall and feature surface. With respect to a crystallographic direction of (100) for example, the Si feature 206 is formed along a plane that is approximately parallel to the substrate surface (substrate surface 204/feature surface 214, see FIG. 2) and/or approximately normal to the substrate surface (sidewall 212, see FIG. 2). However, it should be understood that the substrate surface may also be formed along a plane with a miscut angle. The term "approximately" as used herein is intended to represent a slight deviation of a surface or plane from a perfect crystallographic orientation.

The steps 304 function as a controlled form of defect site to reliable collect dots 210. Also shown are optical path first material dots 210 formed in the Si feature steps 304. The miscut angle 302 is typically in the range between 0.1 and 5 degrees.

The Si feature 206 also has a spacing 306 between steps 304 that is in the range between 1 and 250 nanometers (nm). The optical path first material dots 210 have a diameter 308 in the range between 3 and 100 nm. Knowing the miscut angle 302, the spacing 306, and the dot diameter 308, the first material density of the optical path structure can be reliably predicted. Alternately stated, the area between dots, or the non-first material density of the optical path structure can be predicted. The spacing 306 between steps 304 is dependent upon the particular crystallographic orientation of the Si feature plane 300, and also dependent upon the atomic packing density of the Si substrate 200.

In another aspect, the Si feature 206 includes step cross-sections in the Si feature plane responsive to the miscut angle. A step cross-section, as used herein is understood to be the intersection of 2 steps that are formed along two different directions in the same plane. For example, a step cross-section might be the intersection of perpendicular steps formed in a Si feature plane. The optical path first material dots can be formed in the Si feature step cross-sections.

By controlling the conditions associated with the deposition of dots, especially the nuclei density, the dots can be formed in just the step cross-sections, because the free energy of formation at the nucleation sites with cross-sections is lower than other sites. When deposition conditions are adjusted to render a higher nuclei density, for example, by increasing the deposition rate or decreasing the deposition temperature, dots can be formed in both the steps and step cross-sections. With deposition conditions that yield an even higher nuclei density, dots can be deposited indiscriminately on sites between the steps and away from step cross-sections. That is, dots can be formed on defect-free surfaces, as well as surfaces with defects, as a result of the third nuclei density.

If the single crystal Si substrate surface (204, see FIG. 2) is formed in the (001) direction. The Si feature 206, considering both sidewalls and feature surface, may be formed along planes in the (001), (100), (010), or (110) directions. As noted above, the Si feature may have miscut angles that prevent the planes from being perfectly aligned with the above-mentioned crystallographic directions. Likewise, if the single crystal Si substrate surface is formed in the (110) or (111) direction, the Si feature may be formed along a plane in a direction parallel to the (110) or (111) directions, respectively, or a plane perpendicular to the (110) or (111) directions, respectively.

FIG. 4 is a partial cross-sectional view featuring an alternate aspect of the optical path structure 208 of FIG. 2. In this aspect, the optical path 208 further includes a Si layer 400 overlying the first material dots 210 formed on the sidewall (surface) 216 (214) of the Si feature 206. Then, first material dots 210 are formed on the Si layer 400. Although only a single layer of Si is shown interposed between the 3D dot levels 402 and 404, it should be understood that the optical path structure is not limited to any particular number of dot/Si/dot layers.

Functional Description

FIGS. 5 through 10 illustrate steps in the fabrication of the present invention 3D quantum dot IR optical path structure. FIG. 5 depicts a cross-sectional view of a Si substrate. As seen in FIG. 6, a standard photolithographic technique can be used to define the surface of Si. Then a dry etching is used to etch the Si substrate to a depth of about 1 $\mu$m, for example, to form trench, via, or pillar structures. After a proper cleaning, SiGe or Ge quantum dots are deposited on features. The gap 600 between the sidewalls can be as small as 100 nm, and the wall thickness 602 can be in the same range.

Due to the lattice mismatch, as predicted using Stranski-Krastanow, Ge, or SiGe dots are formed on the vertical sidewalls as well as horizontal (feature surface) areas, see FIG. 7.

To further control the sites and the size distribution of the quantum dots, the Si substrate surface, feature surface, and sidewalls, can be oriented at an angle from perfect crystallographic orientation, to increase the number of steps on both the horizontal surface and the vertical walls. For example, the Si substrate surface may be miscut with respect to the (100) direction. Due to the decrease of energy barrier for nuclei formation, preferred nuclei formation starts at the miscut angle step sites and the cross-section of steps, see FIG. 8.

Figure 9:
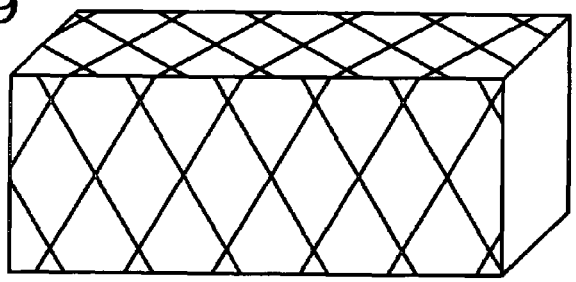

FIG. 9 depicts one wall of the trench structure. When Si is cut at an angle deviated from (100) axis, the number of surface steps increases with the increase of miscut angle.

Figure 10:
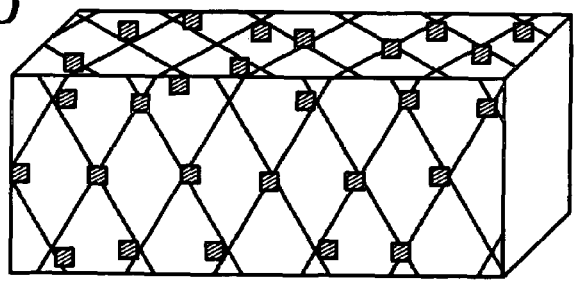

FIG. 10 depicts the wall of FIG. 9 following the deposition of Ge (SiGe) dots. During deposition of Ge or SiGe dots, these steps serve as preferential nucleation sites. With proper control of deposition condition, quantum dots deposition sites can further be limited to the cross-section of steps, where the nucleation free energy is the lowest. Therefore, location and distribution of quantum dots can be controlled.

Figure 11:
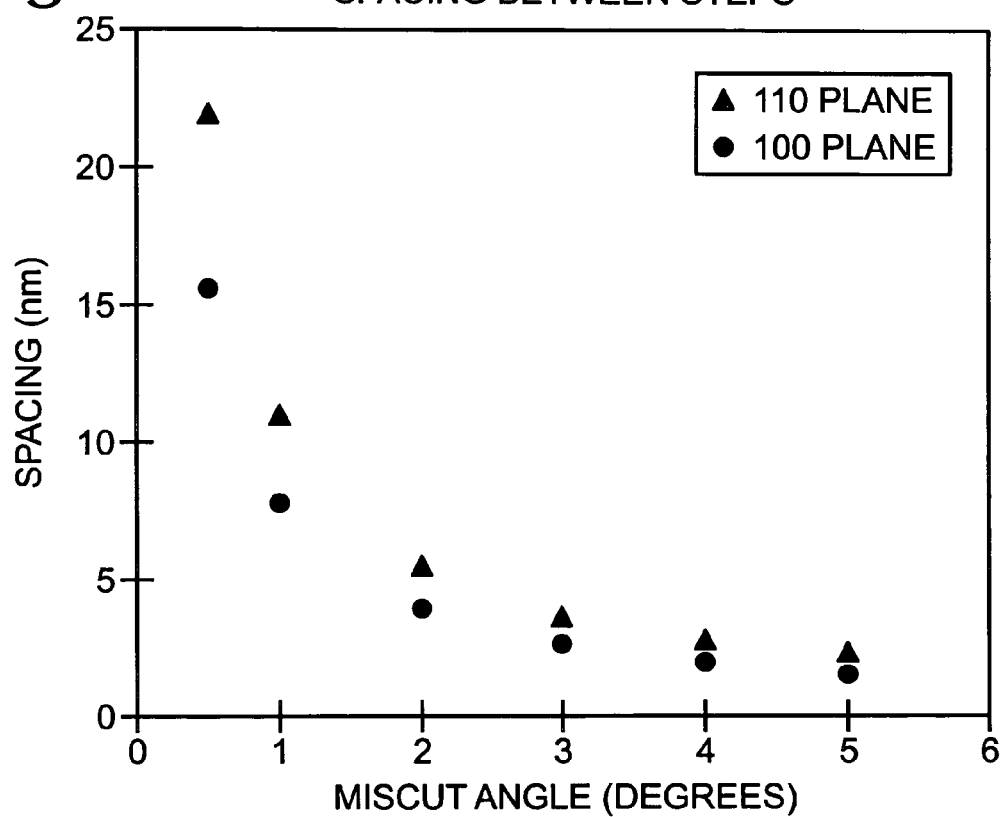
FIG. 11 is a graph depicting an exemplary relationship between the miscut angle and spacing between steps.

FIG. 11 is a graph depicting an exemplary relationship between the miscut angle and spacing between steps.

Figure 12:
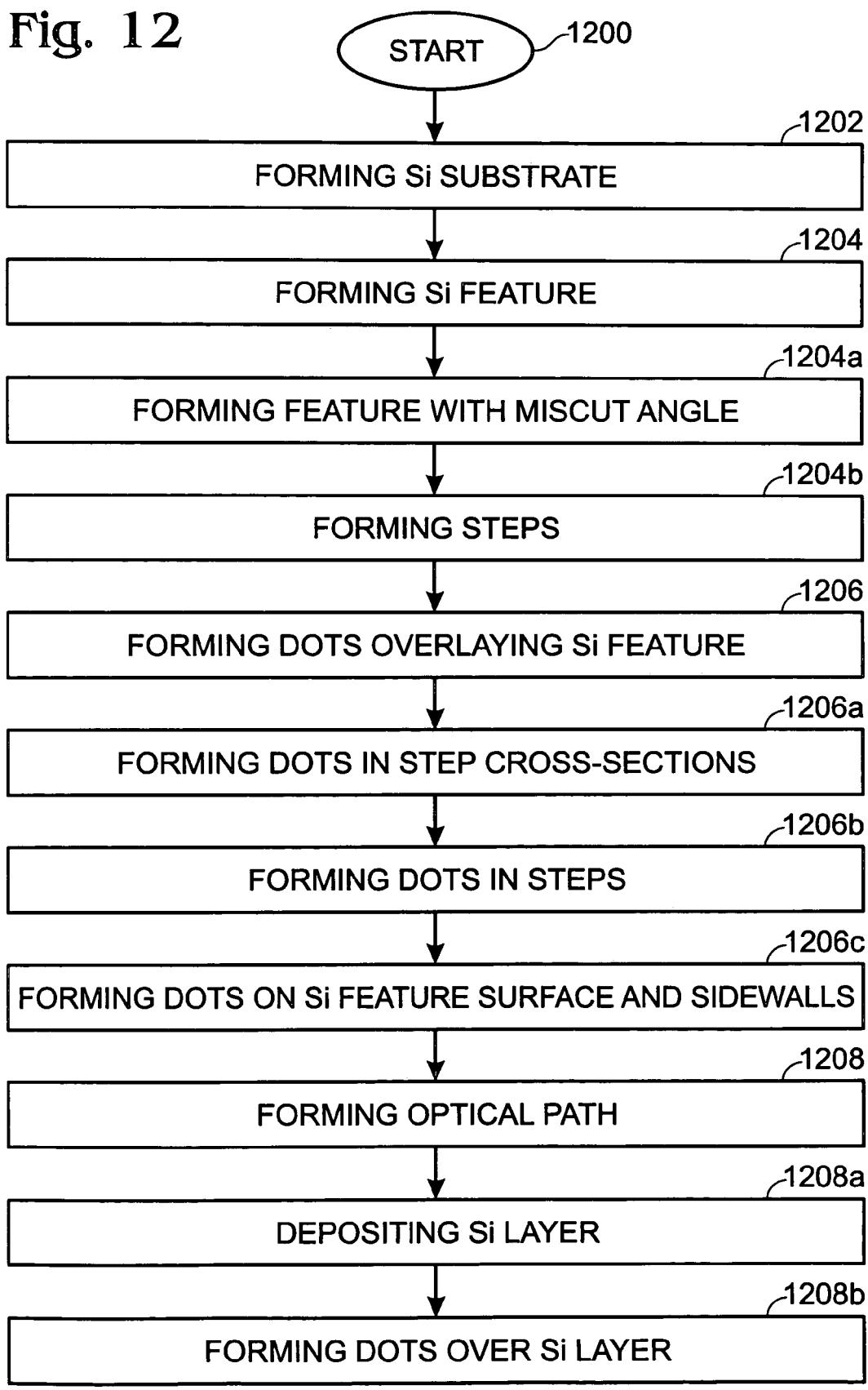
FIG. 12 is a flowchart illustrating the present invention method for selectively forming a 3D quantum dot optical path for IR photodetection.

FIG. 12 is a flowchart illustrating the present invention method for selectively forming a 3D quantum dot optical path for IR photodetection. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1200.

Step 1202 forms a single crystal Si substrate with a surface. Step 1204 forms a Si feature, such as a via, trench, or pillar in the substrate. The Si feature may have a (sidewall) height in the range of 0.3 to 5 microns. Step 1206 forms dots of a first material including Ge overlying the Si feature. In some aspects, Step 1206 forms dots having a diameter in the range between 3 and 100 nm. Step 1208 forms an optical path including first material dots.

Forming dots of a first material including Ge in Step 1206 includes the first material being Ge or SiGe. Alternately stated, the first material is SiGe, with a Ge concentration in the range between 5 and 100%. In some aspects, Step 1206 includes epitaxially growing the first material.

In some aspects of the method, forming a Si feature in the substrate (Step 1204) includes forming a Si feature in the substrate with defect sites. The method may rely upon naturally occurring or random defect sites. Alternately, Step 1204 includes substeps. Step 1204a forms the Si feature along a plane in the substrate with a miscut angle. Forming the Si feature along a plane in the substrate with a miscut angle (Step 1204a) includes forming a plane in a direction approximately parallel to the substrate surface and/or approximately normal to the substrate surface. In other aspects, Step 1204a forms a plane with a miscut angle in the range between 0.1 and 5 degrees.

Step 1204b, in response to the miscut angle, forms steps in the Si feature plane. In other aspects, Step 1204b additionally forms step cross-sections. Then, forming dots of a first material overlying the Si feature (Step 1206) includes depositing dots in the Si feature steps and step cross-sections. In one aspect, Step 1204b forms steps with a spacing between steps in the range between 1 and 250 nanometers (nm). The spacing is dependent upon the atomic packing density of the Si substrate.

More specifically, Step 1206 includes substeps. Step 1206a forms dots overlying the Si feature step cross-sections in response to a first nuclei density. Further, Step 1206b forms dots overlying the Si feature steps in response to a second nuclei density, greater than the first nuclei density. Step 1206c forms dots overlying the Si feature sidewalls and feature steps in response to a third nuclei density, greater than the second nuclei density.

In one aspect, forming a single crystal Si substrate with a surface (Step 1202) includes forming the surface in the (001) direction. Then, forming a Si feature along a plane (Step 1204) includes forming the plane in a direction such as the (001), (100), (010), or (110) directions. Alternately, if Step 1202 forms the single crystal Si substrate surface in the (110) or (111) direction, Step 1204 forms the Si feature along a plane in a direction parallel, or perpendicular to (110) or (111) directions, respectively. That is, if Step 1202 forms the substrate in the (110) direction, Step 1204 forms the Si feature along a plane either parallel or perpendicular to the (110) direction. Likewise, if Step 1202 forms the substrate in the (111) direction, Step 1204 forms the Si feature along a plane either parallel or perpendicular to the (111) direction.

In another aspect, forming an optical path including first material dots in Step 1208 includes substeps. Step 1208a deposits a Si layer overlying the first material dots. Step 1208b forms first material dots on the Si layer.

A 3D quantum dot optical path structure and corresponding fabrication process have been presented. Simple surface-normal features such as vias, trenches, and pillars have been used to illustrate the invention. However, the invention may also be applied to more complicated features. Likewise, although particular dot dimensions and spacings have been described, the invention is not necessarily limited to these densities. Other variations and embodiments of the invention will occur to those skilled in the art.

We claim:

1. A method for selectively forming a three-dimensional quantum dot optical path for infrared (IR) photodetection, the method comprising:
   forming a single crystal Si substrate with a surface;
   forming a Si feature in the substrate with defect sites as follows:
      forming the Si feature along a plane in the substrate with a miscut angle; and,
      in response to the miscut angle, forming steps in the Si feature plane;
   forming dots of a first material including germanium (Ge) overlying the Si feature; and,
   forming an optical path including first material dots.

2. The method of claim 1 wherein forming dots of a first material including Ge overlying the Si feature includes forming dots in the Si feature steps.

3. The method of claim 1 wherein forming dots of a first material including Ge includes the first material being selected from the group including Ge and SiGe.

4. The method of claim 1 wherein forming the Si feature along a plane in the substrate with a miscut angle includes forming a plane in a direction selected from the group including approximately parallel to the substrate surface and approximately normal to the substrate surface.

5. The method of claim 4 wherein forming a Si feature includes forming a feature selected from the group including a via, trench, and pillar.

6. The method of claim 5 wherein forming a Si feature includes forming a Si feature having a height in the range of 0.3 to 5 microns.

7. The method of claim 1 wherein forming dots of a first material including Ge includes epitaxially growing the first material.

8. The method of claim 1 wherein forming a single crystal Si substrate with a surface includes forming the surface in the (001) direction; and,
   wherein forming a Si feature along a plane includes forming the plane in a direction selected from the group including (001), (100), (010), and (110) directions.

9. The method of claim 1 wherein forming a single crystal Si substrate with a surface includes forming the surface in a direction selected from the group including the (110) and (111) directions; and,
   wherein forming a Si feature along a plane includes forming the plane in a direction selected from the group including parallel and perpendicular to the (110) and (111) directions, respectively.

10. The method of claim 1 wherein forming the Si feature along a plane in the substrate with a miscut angle includes forming a plane with a miscut angle in the range between 0.1 and 5 degrees.

11. The method of claim 1 wherein forming steps in the Si feature plane in response to the miscut angle includes forming steps with a spacing between steps in the range between 1 and 250 nanometers (nm).

12. The method of claim 11 wherein forming steps with a spacing between steps in the range between 1 and 250 nm includes forming steps having a spacing dependent upon the atomic packing density of the Si substrate.

13. The method of claim 1 wherein forming dots of a first material including Ge includes forming dots having a diameter in the range between 3 and 100 nm.

14. The method of claim 1 wherein forming an optical path including first material dots includes:
   depositing a Si layer overlying the first material dots; and,
   forming first material dots on the Si layer.

15. The method of claim 1 wherein forming dots of a first material including Ge includes forming dots of SiGe with a Ge concentration in the range from 5 to 100%.

16. The method of claim 1 wherein forming steps in the Si feature plane in response to the miscut angle includes forming step cross-sections; and,
   wherein forming dots of a first material including Ge overlying the Si feature includes forming dots in the Si feature step cross-sections.

17. The method of claim 16 wherein forming dots of a first material including Ge overlying the Si feature includes forming dots overlying the Si feature step cross-sections in response to a first nuclei density.

18. The method of claim 17 wherein forming dots of a first material including Ge overlying the Si feature includes forming dots overlying the Si feature steps in response to a second free nuclei density, greater than the first nuclei density.

19. The method of claim 18 wherein forming dots of a first material including Ge overlying the Si feature includes forming dots overlying the Si feature sidewalls and feature steps in response to a third nuclei density, greater than the second nuclei density.

20. A three-dimensional (3D) quantum dot optical path structure for infrared (IR) photodetection, the structure comprising:
   a single-crystal Si substrate with a surface;
   a Si feature formed in the Si substrate surface;
   a 3D optical path with dots of a first material including germanium (Ge) formed on Si feature; and,
   wherein the Si feature is formed along a plane in the substrate with a miscut angle, and includes steps in the Si feature plane responsive to the miscut angle.

21. The structure of claim 20 wherein the optical path first material dots are formed in the Si feature steps.

22. The structure of claim 20 wherein the optical path first material dots include a first material selected from the group including Ge and SiGe.

23. The structure of claim 20 wherein the Si feature is formed along a plane in a direction selected from the group including approximately parallel to the substrate surface and approximately normal to the substrate surface.

24. The structure of claim 23 wherein the Si feature is a feature selected from the group including a via, trench, and pillar.

25. The structure of claim 24 wherein the Si feature has a height in the range of 0.3 to 5 microns.

26. The structure of claim 20 wherein the single crystal Si substrate surface is formed in the (001) direction; and,
   wherein the Si feature is formed along a plane in a direction selected from the group including (001), (100), (010), and (110) directions.

27. The structure of claim 20 wherein the single crystal Si substrate surface is formed in a direction selected from the group including the (110) and the (111) directions; and, wherein the Si feature is formed along a plane in a direction selected from the group including parallel and perpendicular to the (110) and (111) directions, respectively.

28. The structure of claim 20 wherein the Si feature is formed along a plane in the substrate with a miscut angle in the range between 0.1 and 5 degrees.

29. The structure of claim 20 wherein the Si feature has a spacing between steps that is in the range between 1 and 250 nanometers (nm).

30. The structure of claim 29 wherein the single-crystal Si substrate has an atomic packing density; and,
    wherein the Si feature spacing between steps is dependent upon the atomic packing density of the Si substrate.

31. The structure of claim 20 wherein the optical path first material dots have a diameter in the range between 3 and 100 nm.

32. The structure of claim 20 wherein the optical path further includes:
    a Si layer overlying the first material dots formed on the Si feature; and,
    first material dots formed on the Si layer.

33. The structure of claim 22 wherein the optical path first material dots include a first material of SiGe with a Ge concentration in the range from 5 to 100%.

34. The structure of claim 20 wherein the Si feature includes step cross-sections in the Si feature plane responsive to the miscut angle; and,
    wherein the optical path first material dots are formed in the Si feature step cross-sections.

\* \* \* \* \*